United States Patent
Sawamura et al.

(10) Patent No.: US 12,371,618 B2
(45) Date of Patent: Jul. 29, 2025

(54) DRY ETCHING METHOD, METHOD FOR PRODUCING SEMICONDUCTOR DEVICE, AND DRY ETCHING GAS COMPOSITION

(71) Applicant: CENTRAL GLASS COMPANY, LIMITED, Ube (JP)

(72) Inventors: Ryosuke Sawamura, Ube (JP); Shoi Suzuki, Ube (JP); Hiroyuki Oomori, Ube (JP); Akifumi Yao, Ube (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 360 days.

(21) Appl. No.: 17/910,959

(22) PCT Filed: Mar. 4, 2021

(86) PCT No.: PCT/JP2021/008547
§ 371 (c)(1),
(2) Date: Sep. 12, 2022

(87) PCT Pub. No.: WO2021/182311
PCT Pub. Date: Sep. 16, 2021

(65) Prior Publication Data
US 2023/0132629 A1 May 4, 2023

(30) Foreign Application Priority Data

Mar. 13, 2020 (JP) .................. 2020-044078

(51) Int. Cl.
*C09K 13/08* (2006.01)
*H01L 21/311* (2006.01)
(52) U.S. Cl.
CPC ........ *C09K 13/08* (2013.01); *H01L 21/31116* (2013.01)
(58) Field of Classification Search
CPC .... C09K 13/08; C09K 13/00; H01L 21/31116
(Continued)

(56) References Cited

U.S. PATENT DOCUMENTS

| 5,439,553 A | 8/1995 | Grant et al. |
| 5,658,417 A | 8/1997 | Watanabe et al. |

(Continued)

FOREIGN PATENT DOCUMENTS

| CN | 1203533 | 5/2005 |
| JP | 04-199827 | 7/1992 |

(Continued)

OTHER PUBLICATIONS

International Search Report issued May 18, 2021 in International Application No. PCT/JP2021/008547 with English translation.

*Primary Examiner* — Duy Vu N Deo
(74) *Attorney, Agent, or Firm* — Wenderoth, Lind & Ponack, L.L.P.

(57) ABSTRACT

A dry etching method including reacting silicon oxide with: gaseous hydrogen fluoride and a gaseous organic amine compound; a hydrogen fluoride salt of a gaseous organic amine compound; or gaseous hydrogen fluoride, a gaseous organic amine compound, and a hydrogen fluoride salt of a gaseous organic amine compound. The organic amine compound is an organic amine mixture containing at least two compounds represented by the following formula (1):

$$R^1\text{—}N\text{=}R^2R^3 \tag{1}$$

wherein N is a nitrogen atom; $R^1$ is a C1-C10 hydrocarbon group optionally having a ring, a heteroatom, or a halogen atom; $R^2$ and $R^3$ are each a hydrogen atom or a C1-C10 hydrocarbon group optionally having a ring, a heteroatom, or a halogen atom; provided that the hydrocarbon group, when it has a carbon number of 3 or more, may have a branched chain structure or a ring structure.

12 Claims, 1 Drawing Sheet

(58) Field of Classification Search
USPC .................. 252/79.1–79.5; 438/706–745
See application file for complete search history.

(56) References Cited

U.S. PATENT DOCUMENTS

| | | | |
|---|---|---|---|
| 6,024,888 A | 2/2000 | Watanabe et al. | |
| RE38,760 E | 7/2005 | Grant et al. | |
| 2001/0046780 A1 | 11/2001 | Nakagawa | |
| 2009/0275205 A1 | 11/2009 | Kiehlbauch et al. | |
| 2010/0216296 A1 | 8/2010 | Muraki et al. | |
| 2012/0309999 A1* | 12/2012 | Kiehlbauch | H01L 21/31116 556/400 |
| 2016/0163557 A1* | 6/2016 | Hudson | H01J 37/32715 156/345.24 |
| 2017/0025271 A1* | 1/2017 | Hashimoto | H01L 21/31144 |
| 2017/0263437 A1 | 9/2017 | Li et al. | |
| 2017/0263438 A1 | 9/2017 | Li et al. | |
| 2017/0316946 A1* | 11/2017 | Bajaj | H01L 21/322 |
| 2019/0055469 A1 | 2/2019 | Hyakutake | |

FOREIGN PATENT DOCUMENTS

| | | |
|---|---|---|
| JP | 06-181188 | 6/1994 |
| JP | 08-81788 | 3/1996 |
| JP | 09-509531 | 9/1997 |
| JP | 10-303181 | 11/1998 |
| JP | 2001-503571 | 3/2001 |
| JP | 2007-180418 | 7/2007 |
| KR | 10-0870914 | 11/2008 |
| TW | 201732925 | 9/2017 |
| TW | 201800375 | 1/2018 |
| WO | 94-27315 | 11/1994 |
| WO | 98/43285 | 10/1998 |
| WO | 2016/181723 | 11/2016 |

* cited by examiner

Concentration of Amine 2 (dimethylamine) (ppm by volume)

DRY ETCHING METHOD, METHOD FOR PRODUCING SEMICONDUCTOR DEVICE, AND DRY ETCHING GAS COMPOSITION

TECHNICAL FIELD

The present disclosure relates to a dry etching method of dry etching silicon oxide, a method of producing a semiconductor device using the dry etching method, and a dry etching gas composition.

BACKGROUND ART

The production process of semiconductor devices includes etching of a silicon oxide film, such as a CVD oxide film, a thermal oxide film, or a natural oxide film, on a surface of a semiconductor wafer. The silicon oxide film is etched by wet etching with a chemical liquid or plasma etching with reactive gas plasma.

In wet etching, chemical liquids often adversely affect parts other than etching targets. In plasma etching, wafers are liable to electric damage derived from plasma.

Countermeasure attempts include dry etching without plasma has been tried. Some methods of dry etching $SiO_2$ without plasma are disclosed. For example, a hydrogen fluoride gas is used in combination with: water vapor in Patent Literature 1; gaseous methanol in Patent Literature 2; gaseous acetic acid in Patent Literature 3; and gaseous isopropyl alcohol in Patent Literature 4.

For fast $SiO_2$ etching, methods using a gas mixture including a hydrogen fluoride gas and an ammonia gas have been studied. For example, Patent Literature 5 discloses a two-step etching involving an ammonium fluorosilicate (AFS) layer forming step (chemical oxide removal; COR) and a heating step (post heat treatment; PHT). In the AFS layer forming step, a gas mixture including HF gas and $NH_3$ gas is supplied to a surface of a silicon oxide film on a substrate so that the silicon oxide film chemically reacts with the gas mixture and is converted into ammonium fluorosilicate (AFS), thereby forming an AFS layer as a reaction product layer on a silicon layer of the substrate. In the heating step, the AFS layer is heated to be sublimated or thermally decomposed without supplying the gas mixture.

CITATION LIST

Patent Literature

Patent Literature 1: JP H6-181188 A
Patent Literature 2: JP H8-81788 A
Patent Literature 3: JP H9-509531 A
Patent Literature 4: JP 2001-503571 T
Patent Literature 5: JP 2007-180418 A (JP 4890025 B)

SUMMARY OF INVENTION

Technical Problem

The $SiO_2$ etching rate is insufficient in the methods of Patent Literatures 1 to 4.

In the case of the method of Patent Literature 5, for example, when the COR alone is performed, the AFS layer remains as a residue on a surface of a silicon oxide film. Additionally, heating at a temperature higher than 200° C. is required in the PHT to completely remove a thick AFS layer formed in the COR, which causes concern about heat damage to parts other than the silicon oxide film.

Further, since the PHT requires a higher treatment temperature than the COR, a chamber needs to be heated or cooled every time the steps are switched, or the chamber needs to be replaced in each step, causing a reduction in productivity.

The present disclosure aims to provide a dry etching method capable of etching silicon oxide at a sufficient rate even at a lower temperature of 200° C. or lower without generating a residue, a method of producing a semiconductor device using the dry etching method, and a dry etching gas composition, for example.

Solution to Problem

As a result of extensive studies, the present inventors found that silicon oxide reacts with HF and an organic amine compound as a base instead of $NH_3$, and that the reaction product sublimates at a much lower temperature than ammonium fluorosilicate and thus can be removed at a low temperature. The present inventors also found that use of at least two organic amine compounds further increase the etching rate of silicon oxide. Thus, the present disclosure was completed.

Specifically, the dry etching method of the present disclosure is a dry etching method including reacting silicon oxide with: gaseous hydrogen fluoride and a gaseous organic amine compound; a hydrogen fluoride salt of a gaseous organic amine compound; or gaseous hydrogen fluoride, a gaseous organic amine compound, and a hydrogen fluoride salt of a gaseous organic amine compound,
wherein the organic amine compound is an organic amine mixture containing at least two compounds represented by the following formula (1):

[Chem. 1]

(1)

wherein N is a nitrogen atom; $R^1$ is a C1-C10 hydrocarbon group optionally having a ring, a heteroatom, or a halogen atom; $R^2$ and $R^3$ are each a hydrogen atom or a C1-C10 hydrocarbon group optionally having a ring, a heteroatom, or a halogen atom; provided that the hydrocarbon group, when it has a carbon number of 3 or more, may have a branched chain structure or a ring structure and that the heteroatom in the hydrocarbon group is a nitrogen atom, an oxygen atom, a sulfur atom, or a phosphorus atom; further, $R^1$ and $R^2$, when both of them are hydrocarbon groups having a carbon number carbon number of 1 or more, may be directly bonded to each other to form a ring structure; further, $R^1$ or $R^2$, which is directly bonded by a double bond to form a ring structure, may form an aromatic ring in the absence of $R^3$; and $R^1$, $R^2$, and $R^3$ may be hydrocarbon groups which are the same as or different from one another.

In the dry etching method of the present disclosure, silicon oxide can react with the organic amine mixture, and the silicon oxide can be dry etched at a higher rate than before.

In the dry etching method of the present disclosure, preferably, the organic amine mixture contains at least a secondary amine and a tertiary amine, and preferably, the organic amine mixture contains the secondary amine in an amount of 10 ppm by volume to 10% by volume relative to a total amount of the tertiary amine and the secondary amine.

In the dry etching method of the present disclosure, when the organic amine mixture contains at least a secondary amine and a tertiary amine, and when the organic amine mixture contains the secondary amine in an amount of 10 ppm by volume to 10% by volume relative to the total amount of the tertiary amine and the secondary amine, the silicon oxide can be dry etched at a higher rate.

In the dry etching method of the present disclosure, preferably, the secondary amine is any one of dimethylamine, diethylamine, ethylisopropylamine, and ethylpropylamine, and the tertiary amine is any one of trimethylamine, triethylamine, and dimethylethylamine. More preferably, the secondary amine is dimethylamine, and the tertiary amine is trimethylamine.

In the dry etching method of the present disclosure, preferably, the silicon oxide reacts in a non-plasma state with: the gaseous hydrogen fluoride and the gaseous organic amine mixture; the hydrogen fluoride salt of the gaseous organic amine mixture; or the gaseous hydrogen fluoride, the gaseous organic amine mixture, and the hydrogen fluoride salt of the gaseous organic amine mixture.

When "etching in a plasma state", a halogen gas or the like at a pressure of about 0.1 to 10 Torr is introduced into a reactor and a high-frequency power is applied to an outer coil or a counter electrode to generate low-temperature gas plasma in the reactor, whereby etching silicon oxide or the like with a halogen-based active chemical generated in the gas plasma.

The dry etching method of the present disclosure allows reaction of the organic amine mixture in a non-plasma state, and silicon oxide can be dry etched at a higher rate than before without generating the gas plasma.

The method of producing a semiconductor device of the present disclosure includes etching a silicon oxide film on a semiconductor substrate by the dry etching method described above.

The method of producing a semiconductor device of the present disclosure includes etching the silicon oxide film on a semiconductor substrate by the dry etching method described above, so that the silicon oxide film on the semiconductor substrate can be etched at a higher rate, enabling rapid production of desired semiconductor devices.

The dry etching gas composition of the present disclosure is a dry etching gas composition containing hydrogen fluoride and an organic amine mixture, wherein the organic amine mixture contains at least two compounds represented by the above formula (1).

The dry etching gas composition of the present disclosure contains hydrogen fluoride and the organic amine mixture described above, so that silicon oxide can be dry etched at a higher rate than before.

The organic amine mixture of the present disclosure is an organic amine mixture for use in the dry etching method described above, and contains at least two compounds represented by the formula (1).

Advantageous Effects of Invention

According to the dry etching method of the present disclosure, silicon oxide can be etched at a higher rate than before even at a low temperature of 200° C. or lower without generating a residue.

DESCRIPTION OF EMBODIMENTS

Figure 1:
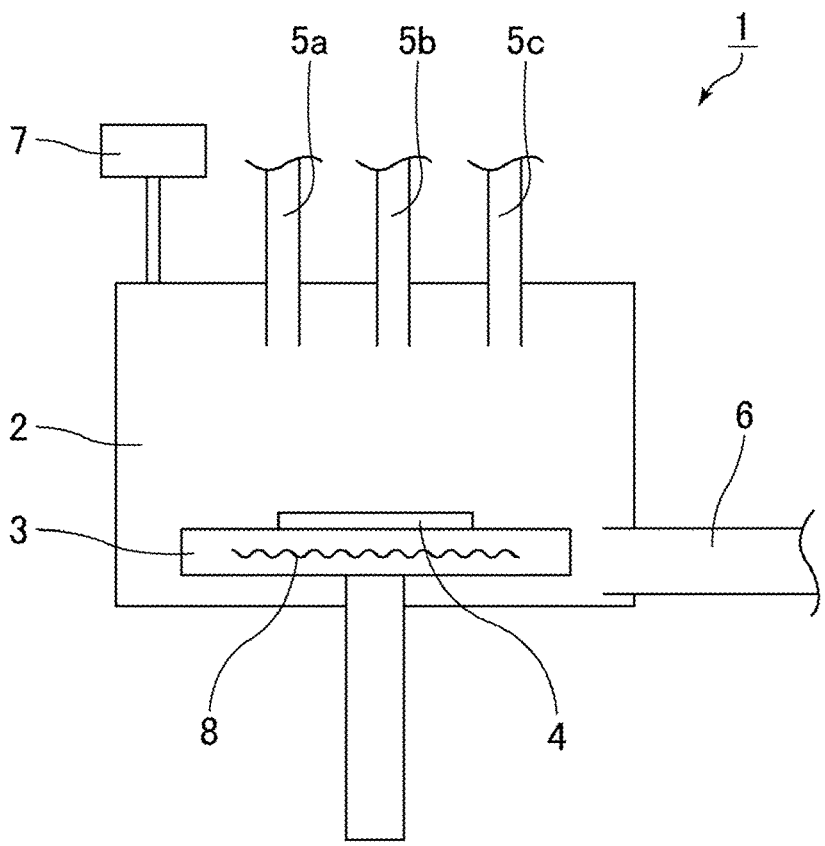
FIG. 1 is a schematic view of a reactor as one example of an etching device for use in a dry etching method according to an embodiment of the present disclosure.

Hereinafter, the present disclosure is described in detail. The following descriptions of constituent elements are examples of embodiments of the present disclosure. The present disclosure is not limited to these specific descriptions. Various modifications can be made within the scope of the gist of the present disclosure.

The dry etching method of the present disclosure is a dry etching method including reacting silicon oxide with: gaseous hydrogen fluoride and a gaseous organic amine compound; a hydrogen fluoride salt of a gaseous organic amine compound; or gaseous hydrogen fluoride, a gaseous organic amine compound, and a hydrogen fluoride salt of a gaseous organic amine compound, wherein the organic amine compound is an organic amine mixture containing at least two compounds represented by the following formula (1):

[Chem. 2]

(1)

wherein N is a nitrogen atom; $R^1$ is a C1-C10 hydrocarbon group optionally having a ring, a heteroatom, or a halogen atom; $R^2$ and $R^3$ are each a hydrogen atom or a C1-C10 hydrocarbon group optionally having a ring, a heteroatom, or a halogen atom; provided that the hydrocarbon group, when it has a carbon number of 3 or more, may have a branched chain structure or a ring structure and that the heteroatom in the hydrocarbon group is a nitrogen atom, an oxygen atom, a sulfur atom, or a phosphorus atom; further, $R^1$ and $R^2$, when both of them are hydrocarbon groups having a carbon number of 1 or more, may be directly bonded to each other to form a ring structure; further, $R^1$ or $R^2$, which is directly bonded by a double bond to form a ring structure, may form an aromatic ring in the absence of $R^3$; and $R^1$, $R^2$, and $R^3$ may be hydrocarbon groups which are the same as or different from one another.

First Embodiment

In the first embodiment, gaseous hydrogen fluoride and an organic amine mixture containing at least two compounds represented by the formula (1) are supplied to an etching device and brought into contact with silicon oxide, whereby the silicon oxide is dry etched. Specifically, one of the following treatment gases is brought into contact with silicon oxide to dry etch the silicone oxide: a treatment gas containing hydrogen fluoride and the organic amine mixture; a treatment gas containing the hydrogen fluoride salt of the organic amine mixture; and a treatment gas containing hydrogen fluoride, the organic amine mixture, and the hydrogen fluoride salt of the organic amine mixture.

When silicon oxide is brought into contact with a treatment gas containing hydrogen fluoride and the organic amine mixture containing at least two compounds represented by the formula (1), the silicon oxide chemically reacts with hydrogen fluoride and the organic amine mixture and is converted into a reaction product such as an organic amine salt of hexafluorosilicic acid. Silicon oxide is removed when the reaction product sublimates into a gas or thermally decomposes into a gas immediately upon generation. Herein, sublimation refers to not only conversion of a solid into a gas without thermal decomposition but also conversion of a solid into a component of a gas through thermal decomposition.

In the dry etching method of the present disclosure, hydrogen fluoride gas and the organic amine mixture may be separately supplied and mixed to form a treatment gas in an etching device. Alternatively, hydrogen fluoride and the organic amine mixture may be reacted with each other in advance into hydrogen fluoride salts of multiple organic amines, and then the salt may be supplied as a gas into an etching device. In the case of separately supplying hydrogen fluoride gas and the organic amine mixture and mixing them in the etching device, hydrogen fluoride salts of multiple organic amines is generated in at least a portion in the etching device. Thus, three components, i.e., the gaseous hydrogen fluoride, the gaseous organic amine mixture, and the hydrogen fluoride salt of the organic amine mixture, coexist in the etching device.

These components may contact silicon oxide. Alternatively, only the hydrogen fluoride salt of the organic amine mixture may contact silicon oxide, or only the gaseous hydrogen fluoride and the organic amine mixture may contact the silicon oxide.

Ultimately, in any case, an organic amine salt of hexafluorosilicic acid is generated as a result of the reaction with the silicon oxide.

The mixing ratio of the organic amine mixture to hydrogen fluoride in the treatment gas is preferably 0.001 or more and 100 or less, more preferably 0.01 or more and 10 or less, particularly preferably 0.1 or more and 5 or less, as determined by dividing a total number of moles of the organic amine compound in the organic amine mixture by a number of moles of hydrogen fluoride.

In the dry etching method of the present disclosure, the organic amine compound may be an organic amine mixture containing at least two compounds represented by the formula (1).

In the compound represented by the formula (1), examples of $R^1$ include a methyl group, an ethyl group, a propyl group, and a butyl group. Hydrogen atoms constituting these organic groups may be partially replaced by halogen atoms such as fluorine or chlorine. Examples of $R^2$ and $R^3$ include a hydrogen atom, a methyl group, an ethyl group, a propyl group, and a butyl group. Hydrogen atoms constituting these organic groups may be partially or entirely replaced by halogen atoms such as fluorine or chlorine. The organic amine compound represented by the formula (1) may be a heterocyclic amine having a five-membered ring structure or a six-membered ring structure.

Specific examples of the compounds in the organic amine mixture include monomethylamine, dimethylamine, trimethylamine, dimethylethylamine, diethylmethylamine, monoethylamine, diethylamine, triethylamine, mono-normal propylamine, ethylpropylamine, di-normal propylamine, monoisopropylamine, ethylisopropylamine, diisopropylamine, monobutylamine, dibutylamine, monotertiary butylamine, ditertiary butylamine, pyrrolidine, piperidine, piperazine, pyridine, and pyrazine. Other examples include the above-described compounds in which part or all of C—H bonds are replaced by C—F bonds (e.g., trifluoromethylamine, 1,1,1-trifluorodimethylamine, perfluorodimethylamine, 2,2,2-trifluoroethylamine, perfluoroethylamine, bis(2,2,2-trifluoroethyl)amine, perfluorodiethylamine, and 3-fluoropyridine).

These compounds are preferred because they each have a conjugated acid having a pKa of not less than 3.2, which is the pKa of hydrogen fluoride (HF), and thus can form a salt with hydrogen fluoride, have a constant vapor pressure in a temperature range OF 20° C. to 100° C., and can be supplied as gas without decomposition in the temperature range. The organic amine mixture of the present disclosure can be obtained by mixing at least two of these compounds.

In terms of easy availability, preferred examples of the compound include monomethylamine, dimethylamine, trimethylamine, triethylamine, monoethylamine, monopropylamine, ethylpropylamine, isopropylamine, ethylisopropylamine, 1,1,1-trifluorodimethylamine, 2,2,2-trifluoroethylamine, and bis(2,2,2-trifluoroethyl)amine. Preferably, the organic amine mixture of the present disclosure is obtained by mixing at least two of these compounds.

The organic amine compounds preferably include a secondary amine and a tertiary amine for increasing the etching rate of the silicon oxide. Specific examples of the secondary amine include dimethylamine, diethylamine, ethylisopropylamine, ethylpropylamine, di-normal propylamine, diisopropylamine, dibutylamine, and ditertiary butylamine. Specific examples of the tertiary amine include trimethylamine, dimethylethylamine, diethylmethylamine, and triethylamine.

The organic amine mixture of the present disclosure is not limited, and may contain two organic amines represented by the formula (1) or three or more organic amines represented by the formula (1). Specific examples of combinations of organic amines constituting the organic amine mixture include a combination of trimethylamine and dimethylamine, a combination of trimethylamine and monomethylamine, a combination of trimethylamine and dimethylethylamine, a combination of trimethylamine, dimethylamine, monomethylamine, and dimethylethylamine, a combination of triethylamine and ethylisopropylamine, and a combination of triethylamine and diethylamine.

The organic amine mixture may further contain ammonia.

Preferably, the organic amine mixture contains the secondary amine in an amount of 10 ppm by volume to 10% by volume relative to the total amount of the tertiary amine and the secondary amine. More preferably, the organic amine mixture contains the secondary amine in an amount of 100 ppm by volume to 5000 ppm by volume relative to the total amount of the tertiary amine and the secondary amine.

In the dry etching method of the present disclosure, preferably, the secondary amine is any one of dimethylamine, diethylamine, ethylisopropylamine, and ethylpropylamine, and the tertiary amine is any one of trimethylamine, triethylamine, and dimethylethylamine. More preferably, the secondary amine is dimethylamine, and the tertiary amine is trimethylamine.

In this case, more preferably, the organic amine mixture contains dimethylamine in an amount of 10 ppm by volume to 10% by volume relative to the total amount of trimethylamine and dimethylamine. More preferably, the organic amine mixture contains dimethylamine in an amount of 100 ppm by volume to 5000 ppm by volume relative to the total amount of trimethylamine and dimethylamine.

The dry etching gas composition of the present disclosure is a dry etching gas composition containing hydrogen fluoride and an organic amine mixture, wherein the organic amine mixture contains at least two compounds represented by the following formula (1):

[Chem. 3]

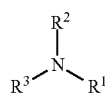

(1)

wherein N is a nitrogen atom; $R^1$ is a C1-C10 hydrocarbon group optionally having a ring, a heteroatom, or a halogen atom; $R^2$ and $R^3$ are each a hydrogen atom or a C1-C10 hydrocarbon group optionally having a ring, a heteroatom, or a halogen atom; provided that the hydrocarbon group, when it has a carbon number of 3 or more, may have a branched chain structure or a ring structure and that the heteroatom in the hydrocarbon group is a nitrogen atom, an oxygen atom, a sulfur atom, or a phosphorus atom; further, $R^1$ and $R^2$, when both of them are hydrocarbon groups having a carbon number of 1 or more, may be directly bonded to each other to form a ring structure; further, $R^1$ or $R^2$, which is directly bonded by a double bond to form a ring structure, may form an aromatic ring in the absence of $R^3$; and $R^1$, $R^2$, and $R^3$ may be hydrocarbon groups which are the same as or different from one another.

In the dry etching gas composition of the present disclosure, preferably, the organic amine mixture contains at least a secondary amine and a tertiary amine. More preferably, the secondary amine is any one of dimethylamine, diethylamine, ethylisopropylamine, and ethylpropylamine, and the tertiary amine is any one of trimethylamine, triethylamine, and dimethylethylamine. Still more preferably, the secondary amine is dimethylamine, and the tertiary amine is trimethylamine.

The dry etching gas composition of the present disclosure may substantially consist of hydrogen fluoride and the organic amine mixture. The dry etching gas composition may or may not contain an inert gas.

Preferably, the organic amine mixture constituting the dry etching gas composition contains the secondary amine in an amount of 10 ppm by volume to 10% by volume relative to the total amount of the tertiary amine and the secondary amine. More preferably, the organic amine mixture contains the secondary amine in an amount of 100 ppm by volume to 5000 ppm by volume relative to the total amount of the tertiary amine and the secondary amine.

The inert gas is preferably at least one selected from the group consisting of $N_2$, He, Ne, Ar, Kr, and Xe, with Ar and $N_2$ being more preferred. The proportion of the inert gas in the dry etching gas composition is preferably 0 or more and 100 or less, more preferably 10 or less, particularly preferably 5 or less, as determined by dividing the number of moles of the inert gas by the number of moles of hydrogen fluoride.

The contact temperature between the dry etching gas composition and the silicon oxide (i.e., the temperature of the silicon oxide) is not limited as long as it is a temperature at which a reaction product of the silicon oxide, hydrogen fluoride, and organic amine mixture undergoes sublimation or thermal decomposition. However, in terms of productivity and damage to the treatment target substrate, the contact temperature is preferably 200° C. or lower, more preferably 150° C. or lower, particularly preferably 120° C. or lower. For example, the contact temperature is preferably 20° C. or higher, more preferably 50° C. or higher, particularly preferably 80° C. or higher.

The pressure at the contact between the dry etching gas composition and the silicon oxide is not limited, but is preferably 0.1 Pa or more and 100 kPa or less, more preferably 0.5 Pa or more and 50 kPa or less, particularly preferably 1 Pa or more and 10 kPa or less.

The temperature and pressure are not necessarily kept constant during the contact between the dry etching gas composition and the silicon oxide, and the temperature and pressure may be varied at regular intervals. For example, time zones in which the temperature is increased and the pressure is reduced may be provided at regular intervals to promote sublimation of the reaction product.

Alternatively, as disclosed in Patent Literature 5, a COR step of contacting the dry etching gas composition with the silicon oxide and a PHT step of sublimating a reaction product without supplying the dry etching gas composition may be performed. In the present embodiment, the PHT step may be performed at 200° C. or lower.

The method of producing a semiconductor device of the present disclosure includes etching a silicon oxide film on a semiconductor substrate by the dry etching method described above.

The semiconductor substrate is usually a silicon substrate. A film other than a silicon oxide film, such as a silicon film, a silicon nitride film, or a metal film, may be exposed from the semiconductor substrate.

The dry etching method of the present embodiment, particularly when used on a treatment target substrate including the silicon oxide film and a silicon nitride film exposed therefrom, enables selective etching of the silicon oxide film over the silicon nitride film. The silicon oxide/silicon nitride etching selection ratio is preferably 2.5 or more, more preferably 5 or more, still more preferably 8 or more, particularly preferably 10 or more. The term "silicon oxide/silicon nitride etching selection ratio" refers to a value obtained by dividing the etching rate of the silicon oxide film by the etching rate of the silicon nitride film. The term "etching rate" refers to a value obtained by dividing the change in thickness of the film before and after etching by the time required for etching. Thus, a higher silicon oxide/silicon nitride etching selection ratio means that the silicon oxide is etched at a higher rate than the silicon nitride.

A semiconductor device can be formed on a semiconductor substrate by applying the dry etching method of the present disclosure to a step of selectively dry etching only $SiO_2$ in a structure in which $SiO_2$ is adjacent to SiN. Examples of the structure include a structure in which a SiN film covers a $SiO_2$ film and a structure in which a $SiO_2$ film and a SiN film are sequentially stacked. For example, in a process of producing a three-dimensional memory, a multilayer film of $SiO_2$ and SiN is formed on a semiconductor substrate, and a through hole is formed in the multilayer film. Then, an etching gas is supplied via the through hole to selectively etch the $SiO_2$ while allowing the SiN to remain by the dry etching method of the present disclosure. Thus, a semiconductor device including a large number of parallel SiN layers with spaces therebetween can be produced.

The method of producing a semiconductor device of the present disclosure can be applied to not only the method of producing a semiconductor device described above, but also a method of producing a semiconductor device involving etching of a silicon oxide film formed on a substrate.

Second Embodiment

A second embodiment of the dry etching method of the present disclosure is a method of etching by separately supplying a treatment gas containing the organic amine mixture and a treatment gas containing hydrogen fluoride into an etching device. Specifically, in the method of the second embodiment, the step of supplying a treatment gas containing the organic amine mixture to silicon oxide in an etching device may be followed by a step of supplying a treatment gas containing hydrogen fluoride to the etching device. The method may include an evacuation step between the above two steps.

The organic amine mixture may be an organic amine mixture containing at least two compounds represented by the formula (1) described in the first embodiment. The organic amine mixture containing at least two compounds represented by the formula (1) has been described in the first embodiment, so that a detailed description thereof is omitted here. The organic amine mixture is preferably an organic amine mixture containing a secondary amine and a tertiary amine. More preferably, the secondary amine is any one of dimethylamine, diethylamine, ethylisopropylamine, and ethylpropylamine, and the tertiary amine is any one of trimethylamine, triethylamine, and dimethylethylamine. Particularly preferred is an organic amine mixture containing trimethylamine and dimethylamine. Use of the organic amine mixture allows silicon oxide to be dry etched at a higher rate than before.

In the second embodiment, presumably, when an organic amine mixture is first introduced into an etching device to allow the gaseous organic amine mixture to contact silicon oxide, at least two organic amine compounds constituting the organic amine mixture will be adsorbed onto a surface of the silicon oxide. When gaseous hydrogen fluoride is subsequently introduced into the etching device to allow hydrogen fluoride to contact the silicon oxide onto which the organic amine compounds constituting the organic amine mixture has been adsorbed, presumably, the at least two adsorbed organic amine compounds constituting the organic amine mixture is converted into a reaction product such as an organic amine salt of hexafluorosilicic acid. Thus, the final reaction product is an organic amine salt of hexafluorosilicic acid that is the same as the reaction product obtained in the first embodiment. The compound sublimates into a gas or thermally decomposes into a gas immediately upon generation.

The first gas to be introduced into the etching device may substantially consist of the organic amine mixture, and the second gas to be introduced may consist of hydrogen fluoride. The organic amine mixture and hydrogen fluoride may or may not contain an inert gas. The inert gas may be at least one selected from the group consisting of $N_2$, He, Ne, Ar, Kr, and Xe. The proportion of the inert gas in the treatment gas is preferably 0 or more and 100 or less, more preferably 10 or less, particularly preferably 5 or less, as determined by dividing the number of moles of the inert gas by the number of moles of hydrogen fluoride.

In the step supplying each treatment gas to the silicon oxide, the contact temperature between the organic amine mixture and the silicon oxide is preferably 200° C. or lower, more preferably 150° C. or lower, particularly preferably 120° C. or lower. The contact temperature between hydrogen fluoride and the silicon oxide is preferably 200° C. or lower, more preferably 150° C. or lower, particularly preferably 120° C. or lower. For example, for each of the organic amine mixture and hydrogen fluoride, the contact temperature is preferably 20° C. or higher, more preferably 50° C. or higher, particularly preferably 80° C. or higher. The contact temperature between the organic amine mixture and the silicon oxide may be the same as or different from the contact temperature between hydrogen fluoride and the silicon oxide.

The pressure during contact between the organic amine mixture and silicon oxide and the pressure during contact between hydrogen fluoride and the silicon oxide are each preferably 0.1 Pa or more and 100 kPa or less, more preferably 0.5 Pa or more and 50 kPa or less, particularly preferably 1 Pa or more and 10 kPa or less.

An embodiment of the silicon oxide to be etched is preferably the same as the first embodiment. The silicon oxide film can be selectively etched over the silicon nitride film by the dry etching method according to the second embodiment. The silicon oxide/silicon nitride etching selection ratio is preferably 2.5 or more, more preferably 5 or more, particularly preferably 10 or more.

In the dry etching method of the present disclosure, the step of supplying a treatment gas containing hydrogen fluoride may be followed by the step of supplying the organic amine mixture. Further, the step of supplying a treatment gas containing hydrogen fluoride and the step of supplying the organic amine mixture may be alternately repeated.

[Etching Device]

According to the dry etching method of the present embodiment, dry etching can be performed using an etching device including a treatment container with a stage on which a treatment target substrate including a silicon oxide film is placed; a hydrogen fluoride gas supply unit for supplying a treatment gas containing hydrogen fluoride to the treatment container; an organic amine mixture supply unit for supplying a dry etching gas composition containing an organic amine mixture to the treatment container; a vacuum exhaust for reducing the pressure inside the treatment container; and a heater for heating the stage. The etching device may further include an inert gas supply unit for supplying an inert gas to the treatment container, if necessary.

FIG. 1 is a schematic view of a reactor as one example of an etching device for use in the dry etching method according to one embodiment of the present disclosure.

A reactor 1 includes a chamber (treatment container) 2 in which a stage 3 to be heated by a heater 8 is disposed. Other heaters (not shown) are disposed around the chamber 2 to heat a chamber wall. A treatment gas is introduced through a hydrogen fluoride gas supply unit 5a and an organic amine mixture supply unit 5b disposed on an upper part of the chamber 2 to bring a dry etching gas composition into contact with a sample (treatment target substrate) 4 on the stage 3. The gas in the chamber 2 is discharged through a gas discharge line 6. The chamber 2 includes an inert gas supply unit 5c, and may optionally supply an inert gas. The gas discharge line is connected to a vacuum exhaust pump (vacuum exhaust) (not shown), so that the pressure inside the chamber 2 can be reduced. The chamber 2 further includes a pressure gauge 7. A supply unit for supplying hydrogen fluoride salt gas of the organic amine mixture may be disposed instead of the hydrogen fluoride gas supply unit 5a and the organic amine mixture supply unit 5b.

The operation to remove silicon oxide from the sample 4 (the treatment target substrate including a silicon oxide film) in the present embodiment is also briefly described.

The stage 3 is heated to a predetermined temperature by the heater 8. Then, a treatment gas is introduced into the chamber 2 from the hydrogen fluoride gas supply unit 5a and the organic amine mixture supply unit 5b under the conditions according to the first embodiment or the second embodiment, whereby the treatment gas is brought into contact with the sample 4. At this time, a reaction product generated by the reaction sublimates immediately upon generation, and is removed from the chamber 2 through the gas discharge line 6.

The reactor 1 further includes a control unit. The control unit may be a computer, for example, and includes a program, a memory, and a CPU. The program includes steps to perform a series of operations in the first embodiment or the second embodiment. According to the program, the temperature of the sample 4, opening and closing of a valve in each gas supply unit, the flow rate of each gas, and the pressure inside the chamber 2 are adjusted, for example. The program is saved in a computer storage medium, such as a compact disc, a hard disc, a magneto-optical disk, or a memory card, and installed in the control unit.

Effects of the Present Embodiment

Use of the dry etching method according to the first embodiment or the dry etching method according to the second embodiment enables etching of silicon oxide without plasma at a high rate even at a lower temperature of 200° C. or lower.

In the dry etching method according to the first embodiment or the dry etching method according to the second embodiment, etching can be performed without leaving a residue from the formation of a reaction product layer on a silicon oxide surface even at a low temperature of 200° C. or lower. Thus, the silicon oxide can be etched in one step without the PHT for sublimating the reaction product. As a result, the silicon oxide can be more efficiently etched than in a cycle etching in which the COR and the PHT are alternately performed.

In the dry etching method according to the first embodiment or the dry etching method according to the second embodiment, the silicon oxide can be etched by the method of the present disclosure without heating a substrate to a high temperature exceeding 200° C. Thus, the method can be suitably applied to a substrate including materials with low heat resistance.

In the dry etching method according to the first embodiment or the dry etching method according to the second embodiment, the silicon oxide can be selectively etched over polycrystalline silicon. In the dry etching method of the present embodiment, the silicon oxide can be selectively etched with a higher silicon oxide/silicon nitride etching selection ratio by the use of an organic amine mixture, than in conventional methods using ammonia. In the dry etching method of the present embodiment, the silicon oxide can be etched at a higher rate than in methods using water, alcohol, or one organic amine.

EXAMPLES

Examples of the present disclosure are described below along with comparative examples. The present disclosure is not limited to the following examples.

In Examples 1 to 4 and Comparative Examples 1 to 3 described below, dry etching was performed using reactors substantially the same as the reactor shown in FIG. 1. A silicon wafer including a silicon oxide film as a treatment target substrate was placed in each reactor, and the etching amount of silicon oxide was measured.

Examples 1 to 4, Comparative Examples 1 to 3

First, the treatment target substrate was placed on a stage in the chamber, and the chamber was evacuated. Then, the temperature of the stage was adjusted to a first treatment temperature shown in Table 1 below. Subsequently, as the first treatment, a treatment gas such as an organic amine mixture shown in Table 1 was supplied into the chamber to a pressure of 30 Torr, and the state was maintained for 30 seconds. Subsequently, the chamber was evacuated to a pressure of 1 Torr. Then, as a second treatment, hydrogen fluoride (HF) gas was supplied to a pressure of 30 Torr, and the state was maintained for 30 seconds. Subsequently, the chamber was evacuated to a pressure of 10 Pa, followed by purging with an inert gas, and the silicon wafer was taken out. The thickness of its silicon oxide film was measured using an optical interference film thickness meter (F20 available from Filmetrics), and the measured thickness was compared against the thickness measured before etching to determine the etching amount.

The following Table 1 shows the type (Amine 1 and Amine 2) of a treatment gas such as an organic amine mixture in the first treatment; the concentration of Amine 2 (content ratio of Amine 2 to the total amount of Amine 1 and Amine 2 (ppm by volume)), the temperature of the silicon wafer during the first treatment; the treatment gas (HF) in the second treatment; the temperature of the silicon wafer during the second treatment; and the etching amount of the silicon oxide film etched by these treatments.

In Examples 1 to 4, as shown in Table 1, the content ratio of Amine 2 to the total amount of Amine 1 and Amine 2 (ppm by volume) was changed, but other conditions were kept the same as the conditions described above.

In contrast, as shown in Table 1, the following gases instead of the organic amine mixture were introduced into the respective chambers to perform dry etching in the comparative examples under the conditions described above: only dimethylamine and HF in Comparative Example 1; only trimethylamine and HF in Comparative Example 2; and only ammonia and HF in Comparative Example 3.

TABLE 1

| | First Treatment | | | | Second Treatment | | |
|---|---|---|---|---|---|---|---|
| | Type of organic amine gas mixture | | Concentration of Amine 2 [Amine 2/(Amine 1 + Amine 2)](ppm by volume) | Treatment temperature | Gas | Treatment temperature (° C.) | Etching amount (nm) |
| | Amine 1 | Amine 2 | | | | | |
| Example 1 | Trimethylamine | Dimethylamine | 38 | 120 | HF | 120 | 143 |
| Example 2 | Trimethylamine | Dimethylamine | 670 | 120 | HF | 120 | 183 |

TABLE 1-continued

| | First Treatment | | | | Second Treatment | | |
|---|---|---|---|---|---|---|---|
| | Type of organic amine gas mixture | | Concentration of Amine 2 [Amine 2/(Amine 1 + Amine 2)](ppm by volume) | Treatment temperature (° C.) | | Treatment temperature (° C.) | Etching amount (nm) |
| | Amine 1 | Amine 2 | | | Gas | | |
| Example 3 | Trimethylamine | Dimethylamine | 9500 | 120 | HF | 120 | 143 |
| Example 4 | Triethylamine | Diethylamine | 180 | 120 | HF | 120 | 123 |
| Comparative Example 1 | — | Dimethylamine | Only dimethylamine | 120 | HF | 120 | 77 |
| Comparative Example 2 | Trimethylamine | — | Only trimethylamine | 100 | HF | 100 | 99 |
| Comparative Example 3 | Ammonia | — | Only ammonia | 120 | HF | 120 | 38 |

As is clear from the comparison results of Examples 1 to 3 and Comparative Examples 1 and 2 shown in Table 1, the use of dimethylamine and trimethylamine as two organic amine compounds resulted in a significant increase in the etching amount, as compared to the use of only dimethylamine (1,000,000 ppm by volume=100% by volume) or the use of only trimethylamine.

Figure 2:
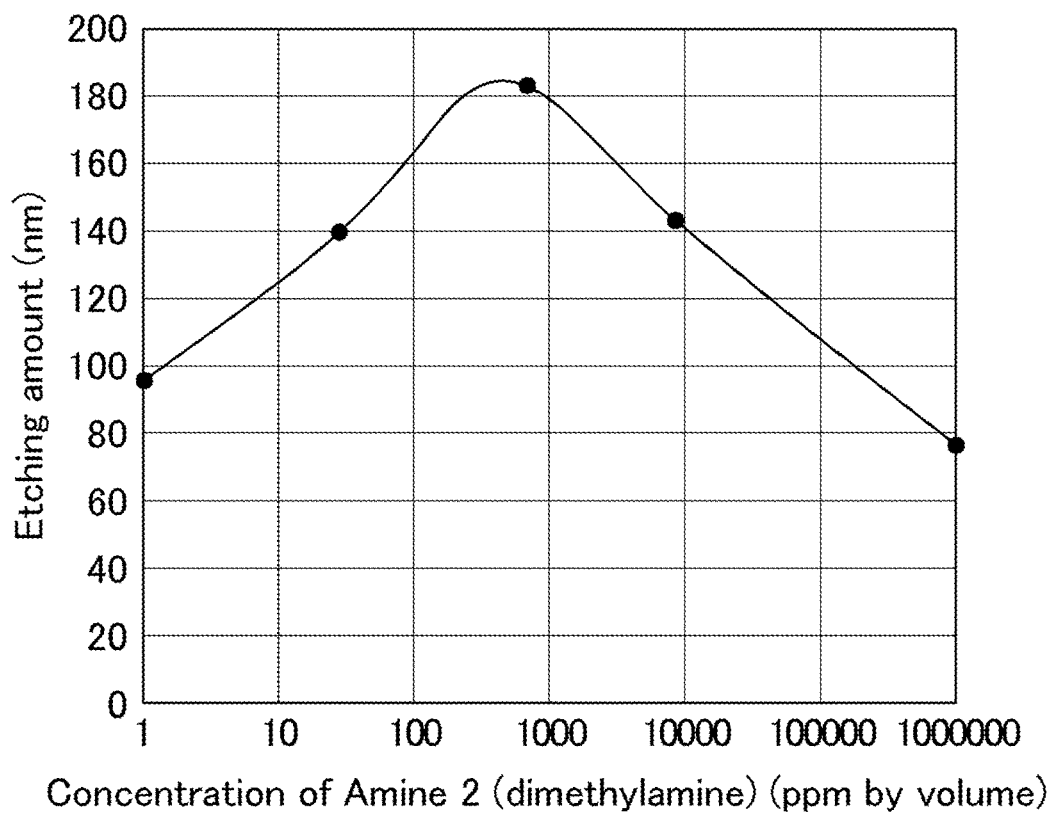
FIG. 2 is a graph showing a relationship between the concentration of Amine 2 (Amine 2/(Amine 1+Amine 2) (ppm by volume)) when dimethylamine was used as Amine 2 and the etching amount in Examples 1 to 3 and Comparative Examples 1 and 2.

FIG. 2 is a graph showing a relationship between the concentration of Amine 2 (Amine 2/(Amine 1+Amine 2) (ppm by volume)) when dimethylamine was used as Amine 2 and the etching amount in Examples 1 to 3 and Comparative Examples 1 and 2. FIG. 2 shows a significant increase in the etching amount, as compared to when the concentration of dimethylamine is 100% by volume (1,000,000 ppm by volume) and when the concentration of dimethylamine is 0 ppm by volume.

With reference to the above examples, presumably, the use of two organic amine compounds (diethylamine+triethylamine) described in Example 4 also resulted in an increase in the etching amount, as compared to the use of the organic amine alone.

This confirms that while etching proceeds by the use of one organic amine compound, the use of two organic amine compounds (secondary amine+tertiary amine) further improves the etching effect.

Specifically, in Examples 1 to 3 each in which the gas mixture containing trimethylamine and dimethylamine was used (the dimethylamine content ratio was 38 ppm by volume in Example 1, 670 ppm by volume in Example 2, and 9500 ppm by volume in Example 3), the etching amount of the silicon oxide film was about 140 to 180 nm, showing a significant increase in the etching amount, as compared to Comparative Example 1 in which only dimethylamine gas was used and Comparative Example 2 in which dimethylamine/(dimethylamine+trimethylamine)=0 ppm by volume.

In Example 4 in which the gas mixture containing diethylamine in an amount of 180 ppm and triethylamine was used, the etching amount of the silicon oxide film was 123 nm.

It is clear from the entire FIG. 2 that the etching amount tends to increase in the range where the content ratio of dimethylamine is 10 ppm by volume to 10% by volume (100,000 ppm), as compared to when only dimethylamine or only trimethylamine was used. In particular, in the range where the content ratio of dimethylamine is about 100 ppm by volume to about 5000 ppm by volume, the etching amount is about 160 nm or more, showing a significant increase in the etching rate in this range.

REFERENCE SIGNS LIST 1 reactor (etching device)
2 chamber (treatment container)
3 stage
4 sample (treatment target substrate)
5a hydrogen fluoride gas supply unit
5b organic amine mixture supply unit
5c inert gas supply unit
6 gas discharge line
7 pressure gauge
8 heater

The invention claimed is:

1. A dry etching gas composition, comprising:
hydrogen fluoride; and
an organic amine mixture,
wherein the organic amine mixture contains at least two compounds represented by the following formula (1):

[Chem. 2]

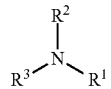

(1)

wherein N is a nitrogen atom; $R^1$ is a C1-C10 hydrocarbon group optionally having a ring, a heteroatom, or a halogen atom; $R^2$ and $R^3$ are each a hydrogen atom or a C1-C10 hydrocarbon group optionally having a ring, a heteroatom, or a halogen atom; provided that the hydrocarbon group, when it has a carbon number of 3 or more, may have a branched chain structure or a ring structure and that the heteroatom in the hydrocarbon group is a nitrogen atom, an oxygen atom, a sulfur atom, or a phosphorus atom; further, $R^1$ and $R^2$, when both of them are hydrocarbon groups having a carbon number of 1 or more, may be directly bonded to each other to form a ring structure; further, $R^1$ or $R^2$, which is directly bonded by a double bond to form a ring structure, may form an aromatic ring in the absence of $R^3$; and $R^1$, $R^2$, and $R^3$ may be hydrocarbon groups which are the same as or different from one another,
the organic amine mixture contains at least a secondary amine and a tertiary amine, and
the organic amine mixture contains the secondary amine in an amount of 10 ppm by volume to 10% by volume relative to a total amount of the tertiary amine and the secondary amine.

2. The dry etching gas composition according to claim 1, wherein the secondary amine is any one of dimethylamine, diethylamine, ethylisopropylamine, and ethylpropylamine, and the tertiary amine is any one of trimethylamine, triethylamine, and dimethylethylamine.

3. The dry etching gas composition according to claim 2, wherein the secondary amine is dimethylamine, and the tertiary amine is trimethylamine.

4. The dry etching gas composition according to claim 3, further comprising an inert gas containing at least $N_2$ or Ar.

5. The dry etching gas composition according to claim 4, wherein the organic amine mixture further contains ammonia.

6. The dry etching gas composition according to claim 4, wherein the proportion of the inert gas in the dry etching gas composition is 100 or less, as determined by dividing the number of moles of the inert gas by the number of moles of hydrogen fluoride.

7. The dry etching gas composition according to claim 4, wherein the mixing ratio of the organic amine mixture to hydrogen fluoride in the treatment gas is 0.001 or more and 100 or less, as determined by dividing a total number of moles of the organic amine compound in the organic amine mixture by a number of moles of hydrogen fluoride.

8. The dry etching gas composition according to claim 1, wherein the organic amine mixture further contains ammonia.

9. The dry etching gas composition according to claim 1, further comprising an inert gas, and the inert gas is at least one selected from the group consisting of $N_2$, He, Ne, Ar, Kr, and Xe.

10. The dry etching gas composition according to claim 9, wherein the proportion of the inert gas in the dry etching gas composition is 100 or less, as determined by dividing the number of moles of the inert gas by the number of moles of hydrogen fluoride.

11. The dry etching gas composition according to claim 1, wherein the mixing ratio of the organic amine mixture to hydrogen fluoride in the treatment gas is 0.001 or more and 100 or less, as determined by dividing a total number of moles of the organic amine compound in the organic amine mixture by a number of moles of hydrogen fluoride.

12. A dry etching gas composition, comprising: hydrogen fluoride and an organic amine mixture,
wherein the organic amine mixture contains dimethylamine, trimethylamine, and an inert gas containing at least $N_2$ or Ar, and
the organic amine mixture contains dimethylamine in an amount of 10 ppm by volume to 10% by volume relative to a total amount of trimethylamine and dimethylamine.

* * * * *